(12) United States Patent
Singh et al.

(10) Patent No.: US 11,076,514 B1
(45) Date of Patent: Jul. 27, 2021

(54) METALIZED FIBER MAT

(71) Applicant: Triton Systems, Inc., Chelmsford, MA (US)

(72) Inventors: Anant K. Singh, Woburn, MA (US); Peter S. Schuler, Westwood, MA (US)

(73) Assignee: TRITON SYSTEMS, INC., Chelmsford, MA (US)

( * ) Notice: Subject to any disclaimer, the term of this patent is extended or adjusted under 35 U.S.C. 154(b) by 0 days.

(21) Appl. No.: 15/724,935

(22) Filed: Oct. 4, 2017

Related U.S. Application Data (60) Provisional application No. 62/404,056, filed on Oct. 4, 2016.

(51) Int. Cl.
| | |
|---|---|
| *H05K 9/00* | (2006.01) |
| *D06M 11/83* | (2006.01) |
| *D04H 1/4234* | (2012.01) |
| *D06M 101/40* | (2006.01) |

(52) U.S. Cl.
CPC ........... *H05K 9/009* (2013.01); *D04H 1/4234* (2013.01); *D06M 11/83* (2013.01); *D06M 2101/40* (2013.01); *D06N 2201/085* (2013.01); *D06N 2209/041* (2013.01); *D06N 2209/143* (2013.01); *D10B 2101/20* (2013.01)

(58) Field of Classification Search
None
See application file for complete search history.

(56) References Cited

U.S. PATENT DOCUMENTS

| | | | | |
|---|---|---|---|---|
| 3,649,865 A | * | 3/1972 | Holmes | H01J 9/14 313/350 |
| 4,022,585 A | * | 5/1977 | Kaye | C25D 7/00 205/158 |
| 4,030,892 A | * | 6/1977 | Mendelsohn | C22C 45/008 442/186 |
| 4,640,711 A | | 2/1987 | Lichti et al. | |
| 4,661,403 A | * | 4/1987 | Morin | D01F 11/127 205/138 |
| 4,668,578 A | * | 5/1987 | Luxon | C08J 5/06 427/387 |
| 4,788,084 A | * | 11/1988 | Morin | C25D 7/0607 427/343 |
| 6,268,408 B1 | | 7/2001 | Dispenza | |
| 6,642,297 B1 | | 11/2003 | Hyatt et al. | |
| 2007/0012900 A1 | | 1/2007 | Callen et al. | |
| 2009/0050362 A1 | * | 2/2009 | Burke | H01B 13/225 174/388 |
| 2009/0117268 A1 | * | 5/2009 | Lewis | B05D 1/60 427/205 |
| 2009/0177268 A1 | * | 7/2009 | Lundkvist | A61F 2/90 623/1.22 |

(Continued)

FOREIGN PATENT DOCUMENTS

| | | |
|---|---|---|
| JP | 2002020851 A | 1/2002 |
| WO | 2008072239 A2 | 6/2008 |

*Primary Examiner* — Arti Singh-Pandey
(74) *Attorney, Agent, or Firm* — Troutman Pepper Hamilton Sanders LLP (57) ABSTRACT

Conductive, lightweight, corrosion-resistant fiber mats are described herein. More particularly a metalized fiber mat of non-woven fibers has a conductive metal coating of a uniform thickness and a corrosion-resistant metal coating of a uniform thickness. Methods of producing such fiber mats are also provided.

12 Claims, 4 Drawing Sheets

(56) References Cited

U.S. PATENT DOCUMENTS

| | | | |
|---|---|---|---|
| 2010/0304063 A1* | 12/2010 | McCrea | C08J 7/04 428/35.8 |
| 2011/0040007 A1 | 2/2011 | Chandrasekhar et al. | |
| 2012/0276332 A1* | 11/2012 | Conolly | C23C 14/562 428/138 |
| 2014/0272170 A1* | 9/2014 | Hales | C01B 21/064 427/456 |
| 2014/0332071 A1 | 11/2014 | Jiang et al. | |
| 2015/0037711 A1 | 11/2015 | Jiang et al. | |
| 2015/0315437 A1 | 11/2015 | Albaugh et al. | |

\* cited by examiner

METALIZED FIBER MAT

This application claims priority to U.S. Provisional Patent Application No. 62/404,056 by Anant K. Singh and Peter Schuler which was filed on Oct. 4, 2016 and the entirety of which is hereby incorporated by reference.

The invention was made with partial funding from the US Government under Contracts FA 8650-07-M-5026 and FA 8650-08-C-5600. The U.S. Government may have certain rights under Federal Acquisition Regulation (FAR).

FIELD

The invention presented herein relates generally to electromagnetic shielding materials. More specifically, the present invention relates to electrically conductive, lightweight, corrosion-resistant fiber mats used to manipulate radiofrequency (RF) energy.

BACKGROUND

Aerospace vehicles rely heavily upon electronic systems and, as such, must be shielded against electromagnetic interference (EMI). EMI interference may be presented in the form of lightning strikes, interference from radio emitters, nuclear electromagnetic pulses and high-power microwave fields, among others. Aerospace vehicles must also have critical survivability features.

Some aerospace vehicles, such as, for example, aluminum hull aircraft, are shielded from EMI interference by virtue of their metallic construction. Typically, however, aerospace vehicles constructed from composite plastic materials do not provide the same shielding capabilities that are inherent in aluminum hull aircraft.

Thus, more and different shielding methods, compositions, apparatus and systems are needed.

SUMMARY

This invention is not limited to the particular compositions or methodologies described, as these may vary.

Various embodiments of the invention are directed to metalized fibers, metalized fiber mats or sheets, and methods of producing such fibers, mats, or sheets. The mats or sheets of such embodiments are generally conductive, lightweight, and corrosion-resistant and can be used to manipulate radiofrequency (RF) energy and enhance aircraft survivability. While the invention is not limited by the use of such fibers, mats, or sheets, in particular embodiments, the mats or sheets described and produced using the methods described herein may be used in aeronautical industry. For example, the metalized fiber mats or sheets of the invention may be used in an aircraft to provide EMI shielding.

In some embodiments, a metalized fiber mat is provided that includes non-woven fibers held together by an organic binder, a conductive metal coating of a uniform thickness on said fibers produced by a vacuum deposition technique, and a corrosion resistant metal coating of a uniform thickness, said corrosion resistant metal having 360 degree coverage over said conductive metal coating.

Embodiments of the invention encompass metalized fibers comprised of numerous materials, and metalized fiber mats or sheets that may include, for example, the metalized fibers and a resinous material.

Any type of base fiber known in the art may be utilized and coated with a metal to make the metalized fibers of the invention. For example, in some embodiments, the base fiber may be fibers of materials including, but not limited to, graphite, carbon, glass, electronic grade glass (or "e-glass"), silica, basalt and combinations thereof, and in other embodiments, the base fiber may be comprised of a polymer such as, for example, polyurethane, polyester, polyamide, polyimide, polyethylene, para-aramid and the like and co-polymers thereof. In particular embodiments, the base fibers include graphite, glass or polyester fibers.

Various embodiments of the invention are directed to base fibers, such as those described above, coated with any metal or metal alloy known in the art. In such embodiments, one or more types of metal or metal alloy are utilized to create metalized fibers that exhibit various properties. For example, in some embodiments, conductive metals or metal alloys may be used to coat the base fibers to create conductive metalized fibers, and in other embodiments, corrosion-resistant metals or metal alloys may be used to coat the base fibers to create corrosion-resistant fibers. In certain embodiments, the base fibers may be sequentially coated with two or more layers of the same or different metal or metal alloys in various thicknesses to create metalized fibers that exhibit various combinations of properties. For example, in particular embodiments, a base fiber may be first coated with a first metal or metal alloy that is conductive and then coated with a second metal or metal alloy that is corrosion-resistant in order to create a metalized fiber that is both conductive and corrosion-resistant. In embodiments where two or more metals or metal alloys are utilized to create metalized fibers that exhibit a combination of material properties, the type of metal or metal alloys used may be such that there is no galvanic corrosion effect between the two metals or metal alloys.

The conductive metal utilized in such embodiments may be any type of conductive metal known in the art including, but not limited to silver, tungsten, molybdenum, copper, annealed copper, gold, rhodium, iridium, platinum, titanium, and the like, and alloys thereof, and in certain embodiments, the conductive metal may be copper or a copper alloy.

Embodiments of the invention are not limited by the type of corrosion-resistant metal used. For example, embodiments of the invention may include base fibers coated with any type of corrosion-resistant metal known in the art including, for example molybdenum, tungsten, tantalum, niobium, nickel, and the like, and alloys thereof, and in particular embodiments, the corrosion-resistant metal may be tungsten or a tungsten-containing alloy.

The arrangement of metal or metal alloy in the metalized fiber mat may vary among embodiments of the invention. For example, in some embodiments, the metalized fiber mat may include metalized fibers comprising a base fiber having a conductive metal or metal alloy coating and a corrosion-resistant metal or metal alloy coating. In other embodiments, a metalized fiber may include more than one conductive metal or metal alloy layer on the base fiber as well as more than one corrosion-resistant metal or metal alloy layer, and in such embodiments, each individual conductive metal or metal alloy layer and each individual corrosion-resistant metal or metal alloy layer may be prepared from different target materials. In still other embodiments, a metalized fiber may include one or more conductive metal or metal alloy layers and/or one or more corrosion-resistant metal or metal alloy layers in various arrangements. For example, in one illustrative embodiment, a base fiber may be coated with a first layer of conductive metal or metal alloy, a second layer of a corrosion-resistant metal or metal alloy, a third layer of a conductive metal or metal alloy, and a fourth layer of a corrosion-resistant metal or metal alloy. Various embodiments of the invention include numerous such combinations of layers. In certain embodiments, the metalized fiber may include a graphite base fiber having a first, inner conductive metal coating of, for example, copper and an outer corrosion resistant coating of, for example, tungsten. Without wishing to be bound by theory, the use of tungsten in the corrosion-resistant metal or metal alloy coating may provide a relatively low toxicity, environmentally friendly metalized fiber, while still allowing for the production of highly uniform coatings with 360 degree coverage.

In various embodiments of the invention, the conductive metal layer and the corrosion-resistant metal layer may be coupled to one another and may each be of a generally uniform thickness. While minor variations in the thickness of the metal layer(s) on the base fiber may occur as a result of the coating process, the metalized fibers of the invention have an extremely uniform coating of each metal layer 360 degrees about the base fiber, when compared to coatings disclosed in prior art.

In some embodiments, each metal coating may have a thickness that is substantially the same along the length of the base fiber and that is substantially the same as any other metal or metal alloy layer. For example, in certain embodiments, each individual metal or metal alloy layer may have a substantially uniform thickness of from about 10 E-7 meters (m) to about 10 E-6 meters (m). In other embodiments, the metal or metal alloy layers may have different thicknesses relative to each other. For example, in some embodiments, a conductive metal or metal alloy layer may have a uniform thickness along the length of the base fiber that is greater than the uniform thickness of the corrosion-resistant metal or metal alloy layer. In other embodiments, the conductive metal or metal alloy layer may have a uniform thickness that is less than the uniform thickness of the corrosion-resistant metal or metal alloy layer. For example, in one exemplary embodiment, a base fiber may have a conductive metal or metal alloy layer having a uniform thickness of about 10 E-7 m and a corrosion-resistant metal or metal alloy layer having a uniform thickness that is greater than 10 E-7 m, such as, for instance, about 3.0 E-7-m to about 5.0 E-7 m. In another exemplary embodiment, the thickness of the corrosion-resistant metal or metal alloy layer may be less than the 3.0 E-7 m thickness of the conductive metal or metal alloy layer such as, for example, about 1.0 E-7 m to about 3.0 E-7 m. In such embodiments, each of the metal or metal alloy layers may have 360 degree coverage over the base fiber, wherein the conductive metal layer has 360 degree coverage over the base fiber and the corrosion-resistant metal layer has 360 degree coverage over the conductive metal layer.

In addition to uniform thickness and 360 degree coverage, the metal or metal alloy coatings of the metalized fibers are more defect-free and higher purity over the length of the fiber at minimal deposition weights resulting in lower surface resistance. In some embodiments, the surface resistance of the metal or metal alloy coating layer processed by this invention are about 10% and 50% lower than surface resistance of electroplated fibers at equivalent metal thickness In other embodiments, the density of each individual metal or metal alloy coating layer may be different depending on the type of coating layer. For example, in some embodiments, the conductive metal or metal alloy layer may have 50% lower surface resistance and 10% fewer defects, as measured by the degree of oxidation of the metal alloys. In such embodiments, the conductivity of the fiber mat may be from less than 0.1-0.2 ohms/sq.

The metalized fibers of various embodiments may be of any length. For example, in some embodiments, the metalized fiber may be a continuous fiber that is centimeters or meters or several meters in length. In other embodiments, the metalized fibers may have discrete relatively short lengths. For example, in certain embodiments, the metalized fibers may have a length of from about 2 mm to about 50 mm, and in particular embodiments, the metalized fibers may have a length of from about 5 mm to about 15 mm. Embodiments of the invention may further include continuous fibers that have been cut or chopped to even smaller lengths.

Embodiments of the metalized fibers of the invention may be integrated into various materials known in the art that include a fiber component. For example, in some embodiments, the metalized fibers of the invention may be incorporated into polymeric sheets, fiber boards, fiber glass, and the like, and in other embodiments, the metalized fibers of the invention may be used as a filler in various polymeric materials. In certain preferred embodiments, the metalized fibers of various embodiments of the invention can be incorporated into a fiber sheet or mat. In some such embodiments, the metalized fibers may be woven or partially woven and combined with a resinous material that is cured or partially cured to form a woven or partially woven metalized fiber mat. In other embodiments, chopped metalized fibers may be combined with a resinous material that is cured or partially cured to form a non-woven metalized fiber mat. Accordingly, various embodiments of the invention are directed to woven and non-woven metalized fiber mats that are prepared using the metalized fibers of the invention.

In additional embodiments of the invention, the woven or non-woven metalized fibers impregnated with the first resinous material may be further combined with a second resinous material that is the same or different than the first resinous material. In certain embodiments, the second resinous material is not fully cured, thereby forming a pre-impregnated fiber ply, and in other embodiments, the pre-impregnated fiber ply may be hardened or cured to form a composite material. In still other embodiments, two or more layers of pre-impregnated fiber ply may be pressed together to form a multilayer fiber ply, and such multilayer fiber plies may be hardened or cured to form a multi-layer composite material. Thus, embodiments of the invention include pre-impregnated fiber plies, composite materials, multilayer fiber plies, and multilayer composites prepared from the woven or non-woven metalized fiber mats of various embodiments of the invention.

Any type of resinous material or binder known in the art may be used as either the first binder material or the second binder material. For example, in various embodiments, the binder material may include aqueous and non-aqueous including but not limited to polyester, poly vinyl alcohol, acrylic resins, acrylonitrile butadiene styrene (ABS) resins, methyl methacrylate (MMA) resins, polyamides such as, nylon, polycarbonates, polyphenylene oxides, polyimides, polyethylenes, polypropylenes, polystyrenes, and other thermoplastic resins like, acetal homopolymer or copolymer resins, polyethylene terephthalate (PET), and the like or combinations and co-polymers thereof. In other embodiments, the binder material may be homo or co-polymers of materials such as, but not limited to, polyacrylate, such as methyl-methacrylate, urethane resin; however, other polymer chemistries are also contemplated and may be utilized in context with the invention. In particular embodiments, the binder material may be formulated to have specific properties, such as, for example, adhesiveness or high strain-tofailure ratio. Additionally, the binder material of the invention may be at various stages of curing before combining or impregnation. For example, in some embodiments, the binder material may be partially pre-cured before combining with the metalized fibers.

For example, in one illustrative embodiment, a non-woven metalized fiber mat may include chopped metalized fibers including graphite base fiber, a conductive metal layer of copper or a copper alloy, and a corrosion-resistant metal layer of tungsten or a tungsten alloy, and a binder material of poly vinyl alcohol or polyester in aqueous or non-aqueous solution or dispersion. In one aspect of the invention, the metalized fiber mat of this embodiment may be infiltrated with a second resinous material wherein the second resinous material is not fully cured in order to make a pre-impregnated fiber ply, known are a pre-preg. In another aspect, the second resinous material may be partially or fully cured or hardened to form a composite. In still other embodiments, one or more of the metalized fiber mats that have been infiltrated with the second resinous material to form a pre-impregnated fiber ply may be layered and the resinous material may be hardened or cured or an adhesive may be used to form a multi-layer structure.

The metalized fiber mat, pre-impregnated fiber ply, composite, or multi-layer composite of the invention may have numerous properties or combinations of properties depending upon the types of materials used to form such structures. In certain embodiments, the metalized fiber mat has an areal density less than about 50 g/m$^2$, and in some embodiments, an areal density of about 10 g/m$^2$ to about 25 g/m$^2$. In other embodiments, the metalized fiber mat has a surface resistance of less than about 5 ohms/sq and, in particular embodiments, less than 0.2 ohms/sq. In still other embodiments of the invention, the metalized fiber mat has a tensile strength of >10N for a 15 mm wide section in both machine and transverse direction. Without wishing to be bound by theory, such a tensile strength may allow for additional processing of the mat prior to its final application.

In various embodiments, the resinous material may include one or more additives such as, for example, colorants, UV stabilizers, preservatives, antioxidants, fillers, adhesives, thickeners, polymerization accelerators, cross-linking agents, curing agents and the like. Curing agents and polymerization accelerators are well known in the art, and any curing agent or polymerization accelerator appropriate to the particular resinous material or binder utilized may be used. In certain embodiments, the resinous material may include a crosslinking agent and/or polymerization accelerator, and such crosslinking agent and/or polymerization accelerator may be selected based on the particular type of resinous material used.

In some embodiments, the metalized fiber mat, pre-impregnated fiber ply, composite, or multi-layer composite may further include an adhesive layer on one or more outer surfaces, or in the case of a multi-layer composite, between one or more of the layers that make up the multi-layer composite. Such an adhesive layer may be utilized to bind layers of composite to one another to form a multi-layer composite or to bind the metalized fiber mat, pre-impregnated fiber ply, composite, or multi-layer composite to another surface or material. In other embodiments, the metalized fiber mat, pre-impregnated fiber ply, composite, or multi-layer composite may further include at least one sheet of vibration dampening material, such as, for example, a foam or rubber material. The adhesive layer of embodiments of the invention may be utilized in integrating such a vibration dampening material.

In various embodiments, the metalized fiber mat, pre-impregnated fiber ply, composite, or multi-layer composite of the invention may be formed in flat sheets of varying sizes and shapes. Such sheets may be cut or reshaped depending on the particular use or the surface to which such sheets are applied.

In other embodiments, the first and/or second resinous material may be selected to create a metalized fiber mat, pre-impregnated fiber ply, composite, or multi-layer composite that is pliable or bendable. Such pliable or bendable sheets may be cut to fit a particular use and, as such, may take on numerous shapes. For example, in one embodiment, a flexible or bendable metalized fiber mat may be used to cover curved surfaces. In other embodiments, the metalized fiber mat or pre-impregnated fiber ply may be constructed to conform to a predetermined surface. For example, a metalized fiber mat or pre-impregnated fiber ply may be applied to a surface or a mold and then hardened or cured to create a composite, or multi-layer composite having a specific shape.

The metalized fiber mat, pre-impregnated fiber ply, composite, or multi-layer composites of the invention may be installed by any method known in the art that provides proper coverage of the surface and allows the metalized fiber mat to function properly. For example, the metalized fiber mats, pre-impregnated fiber plies, composites, or multi-layer composites of the invention may be attached to a surface by adhesives, such as epoxy, mechanical fasteners and thermal bonding, to name a few.

The metalized fiber mats, pre-impregnated fiber plies, composites, or multi-layer composites of the invention can be used in a variety of applications. For example, in some embodiments, the metalized fiber mat may be integrated into a vehicle. The term "vehicle," as used herein, refers to any object capable of mobility including, for example, automobiles, ships, tanks, trucks, locomotives, aerospace vehicles or aircraft, and the like. The term "aerospace vehicle," as used herein, is meant to encompass any aircraft, vehicle or other projectile that travels through the air or space including, but not limited to, airplanes, helicopters, missiles, and projectiles or objects capable of flight. For example, in particular embodiments, the metalized fiber mat, pre-impregnated fiber ply, composite, or multi-layer composite may be integrated into and positioned over structural components of an aircraft. The metalized fiber mat, pre-impregnated fiber ply, composite, or multi-layer composite may be applied to any portion of the aircraft and may be utilized to create regions of the aircraft that are shielded from EMI. Such portions of the vehicle include, but are not limited to, the hull, wings, baggage compartments, engine, passenger compartment, cockpit, rudders, stabilizers, flaps and so on.

BRIEF DESCRIPTION OF THE DRAWINGS

For a fuller understanding of the nature and advantages of the invention, reference should be made to the following figures, in which.

DETAILED DESCRIPTION

This invention is not limited to the particular compositions or methodologies described, as these may vary. In addition, the terminology used in the description describes particular versions or embodiments only and is not intended to limit the scope of the invention. Unless defined otherwise, all technical and scientific terms used herein have the same meanings as commonly understood by one of ordinary skill in the art. In case of conflict, the patent specification, including definitions, will prevail.

As used herein, the singular forms "a", "an" and "the" include plural reference unless the context clearly dictates otherwise.

As used herein, the term "about" means plus or minus 10% of the numerical value of the number with which it is being used. Therefore, about 50% means in the range of 40%-60%.

The terms "include", "comprise" and "have" and their conjugates, as used herein, mean "including but not necessarily limited to."

"Optional" or "optionally" may be taken to mean that the subsequently described structure, event or circumstance may or may not occur, and that the description includes instances where the event occurs and instances where it does not.

This application is also related to U.S. patent application Ser. No. 15/724,709 entitled NICKEL FREE CONDUCTIVE FILLER by inventors Anant Singh and Peter Schuler filed concurrently herewith on Oct. 4, 2017 and is hereby incorporated by reference in its entirety.

In various embodiments, a continuous base fiber is coated with a first metal or metal alloy layer and a second metal or metal alloy layer to form a continuous metalized fiber. In some embodiments, the continuous metalized fiber may be used to form a woven metalized fiber mat. In certain embodiments, the continuous metalized fiber may be cut or chopped into smaller fragments that may be incorporated into a non-woven metalized fiber mat or used as filler. Therefore, methods of certain embodiments of the invention may include producing a continuous metalized fiber and chopping such continuous metalized fiber.

In certain embodiments, a method for producing a metalized fiber mat is provided comprising the steps of obtaining non-woven fibers, coating said non-woven fiber composite with a first conductive metal, and applying a uniform thickness of a second corrosion resistant metal coating over said first conductive metal coating.

In further embodiments, methods for preparing metalized fiber mats may include the steps of combining chopped metalized fibers with chopped polyester fibers in a liquid resinous material to create a slurry, and fabricating a metalized fiber mat from the slurry. In such embodiments, various amounts of chopped metalized fiber and chopped polyester fiber, in aqueous medium, may be combined depending on factors such as, for example, the ultimate application of the metalized fiber mat, the density of the resinous material, and the like. For example, in certain embodiments, about 80% to about 90% of chopped metalized fibers my be combined with about 10% to about 20% of the chopped polyester fiber. The fabrication step may be carried out by any method and may include any number of individual steps. Accordingly, the step of fabricating may vary in embodiments of the invention. For example, in some embodiments, the step of fabricating may include forming the slurry into a sheet or mat, extracting water from the slurry, and curing, hardening, or polymerizing the resinous material or binder.

Various embodiments of the invention are directed to methods of producing a metalized fiber mat. In some embodiments, the method of producing a metalized fiber mat may include the steps of coating a base fiber with a first metal or metal alloy layer of, for example, copper to provide a conductive layer, and coating the coated base fiber with a second metal or metal alloy layer of, for example, tungsten to provide a corrosion-resistant layer. In such embodiments, the coating of the first metal or metal alloy layer may be performed by a technique such as, for example, electroplating, electroless plating, physical vapor deposition methods such sputtering, and the coating of the second layer may be performed by sputtering.

Certain embodiments are directed to a method for producing a metalized fiber mat comprising the steps of: obtaining a plurality of individual continuous fibers, coating the individual continuous fibers with a first conductive metal, chopping the individual continuous fibers, mixing the chopped fibers with an aqueous dispersion of polyester fiber binder, removing the water and subsequently heating the binder, applying a uniform second corrosion resistant metal coating over the said fiber composite, and infiltrating said coated fibers thereby producing a fiber composite.

In certain embodiments of the invention, methods of producing a metalized fiber mat include a least a first coating step and a second coating step, wherein at least one of the first or second coating steps is not performed by electroless plating. Electroless plating, also known as chemical or auto-catalytic plating, is a non-galvanic type of plating method that involves several simultaneous reactions in an aqueous solution, which occur without the use of external electrical power. The reaction is accomplished when hydrogen is released by a reducing agent and oxidized thus producing a negative charge on the surface of the fiber. One preferred alternative to electroless plating is sputtering. Sputtering (a.k.a. Physical Vapor Deposition or PVD, Vapor Deposition, Vacuum Deposition, Vacuum Coating) is a form of Thin Film Deposition or Metallizing. Without wishing to be bound by theory, some advantages of sputtering relative to other coating processes include: low heat, better film adhesion and corrosion resistance, denser film quality, uniform film coatings over non-flat surfaces and 3-D substrates, and low material costs.

Figure 1:
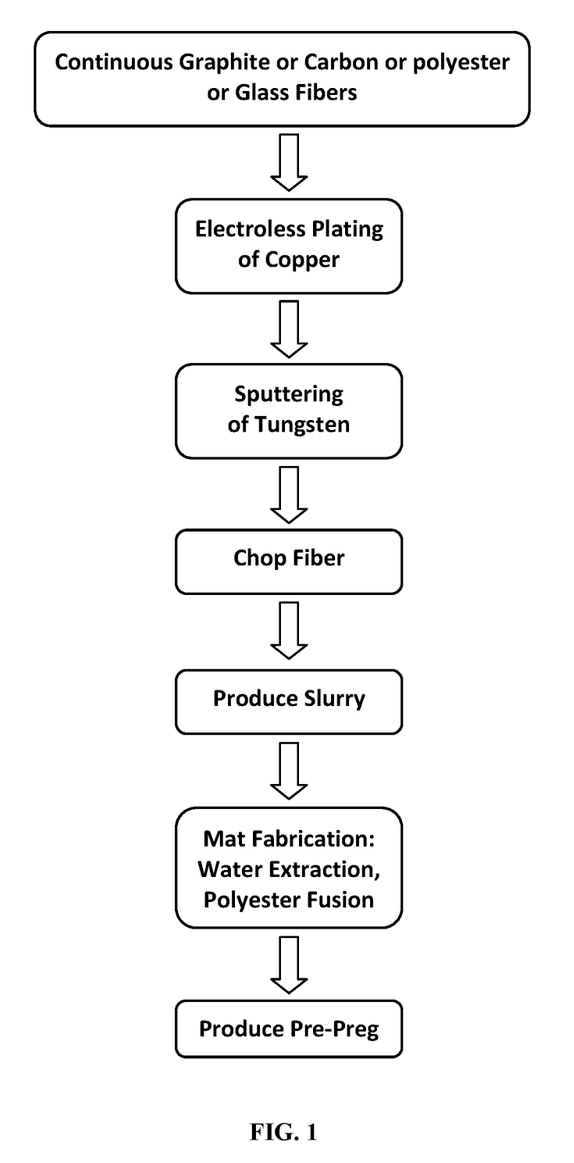
FIG. 1 is a flowchart of a metalized fiber mat fabrication method according to one embodiment of the invention.

In some embodiments, such as the embodiments shown in FIG. 1, a metalized fiber mat may be prepared by coating a continuous fiber with copper using electroless plating, followed by sputter coating a layer of tungsten over the copper layer. The metalized fiber may then be chopped and an aqueous-based slurry containing chopped polyester fibers that are later used as a binder to hold the fiber mat together may be introduced. The metalized fiber mat may then be fabricated by extracting the water and fusing the polyester-based fibers as a binder. Various curing procedures and/or combinations with other metalized fiber mats or resinous materials may occur throughout or following the fabrication method as shown in FIG. 1.

Figure 2:
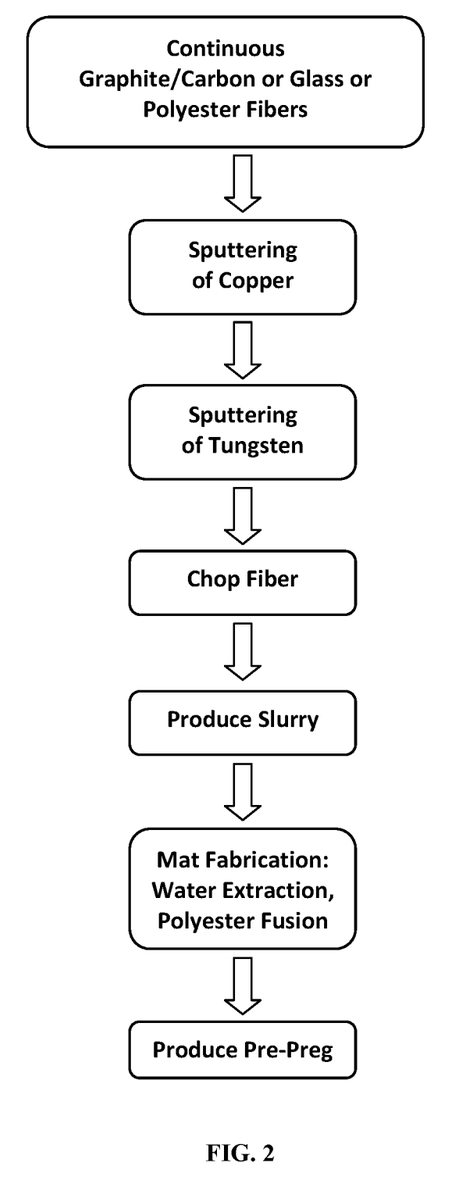
FIG. 2 is a flowchart of a metalized fiber mat fabrication method of another embodiment of the invention.

In other embodiments, such as the embodiments shown in FIG. 2, a metalized fiber mat may be produced by sputter coating a continuous fiber with copper, followed by sputter coating a layer of tungsten over the copper layer. The metalized fiber may then be chopped and an aqueous-based slurry containing chopped polyester fibers that are later used as a binder to hold the fiber mat together may be introduced.

The metalized fiber mat may then be fabricated by extracting the water and fusing the polyester-based fibers as a binder. Various curing procedures and/or combinations with other metalized fiber mats or resinous materials may occur throughout or following the fabrication method as shown in FIG. 2.

Figure 3:
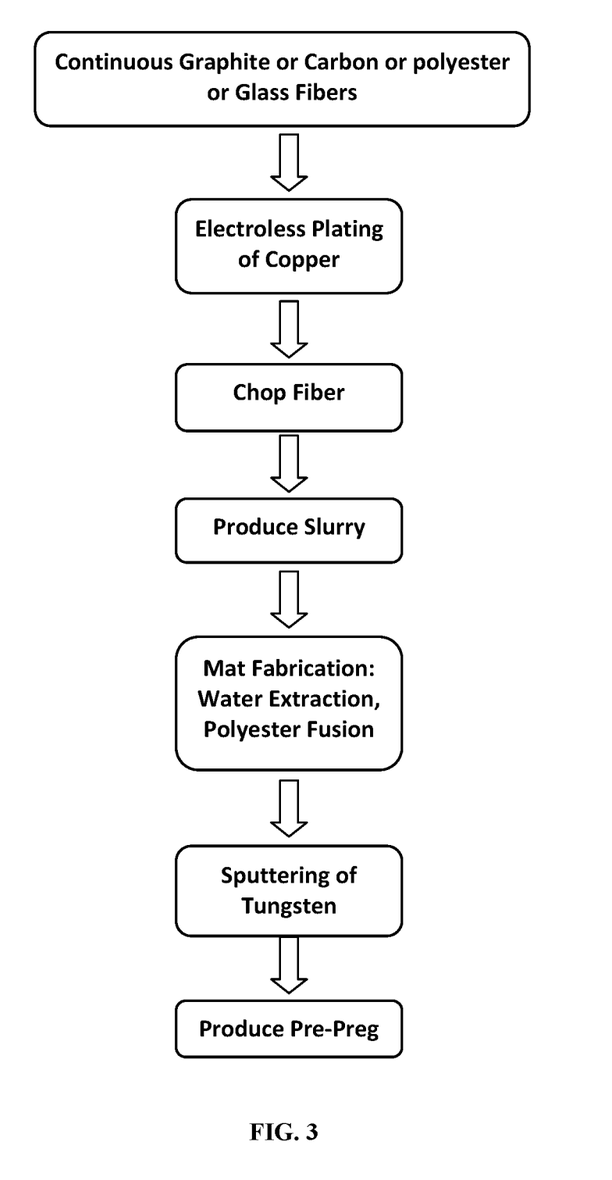
FIG. 3 is a flowchart of a metalized fiber mat fabrication method according to yet another embodiment of the invention.

In additional embodiments of the invention, such as the embodiment shown in FIG. 3, a metalized fiber mat may be prepared by coating a continuous fiber with copper using electroless plating, followed by chopping the metalized fiber and introducing an aqueous-based slurry containing chopped polyester fibers that are later used as a binder to hold the fiber mat together. The metalized fiber mat may then be fabricated by extracting the water and fusing the polyester-based fibers as a binder. The metalized fiber mat is then sputter coated with tungsten. Various curing procedures and/or combinations with other metalized fiber mats or resinous materials may occur throughout or following the fabrication method as shown in FIG. 3.

In still other embodiments, such as the embodiment shown in FIG. 4, a metalized fiber mat may be prepared by chopping the metalized fiber and introducing an aqueous-based slurry containing chopped polyester fibers that are later used as a binder to hold the fiber mat together. A fiber mat may then be fabricated by extracting the water and fusing the polyester-based fibers as a binder. Next, a copper layer followed by a tungsten layer are deposited by sequential sputtering. Various curing procedures and/or combinations with other metalized fiber mats or resinous materials may occur throughout or following the fabrication method as shown in FIG. 4.

Figure 4:
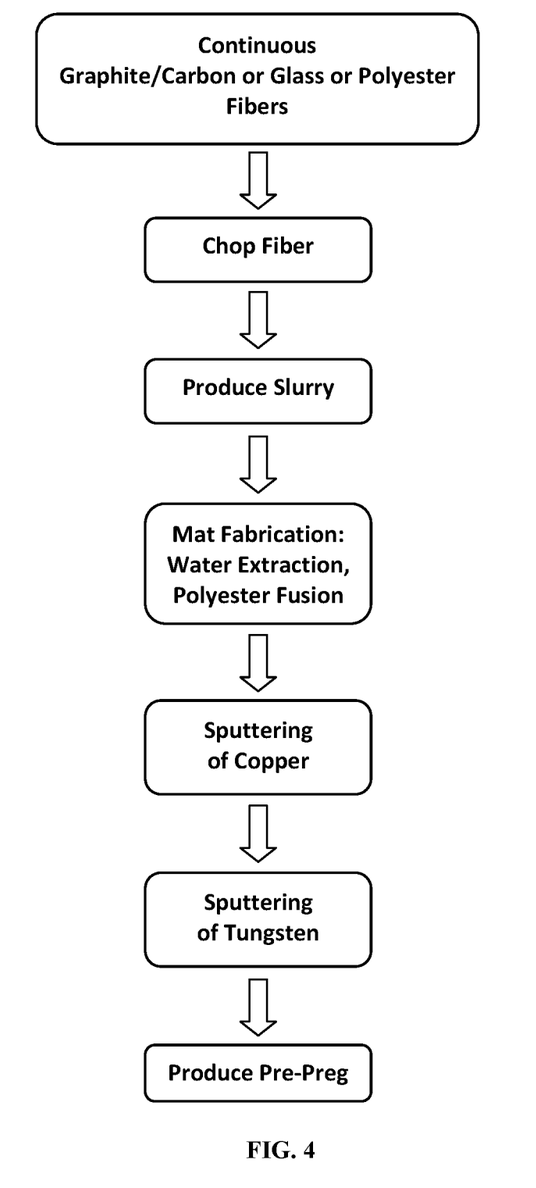
FIG. 4 is a flowchart of a metalized fiber mat fabrication method according to still another embodiment of the invention.

As shown in FIGS. 2 and 4, embodiments of the invention include methods for preparing metalized fibers and metalized fiber mats with no electroless plating step.

As the skilled artisan will appreciate, such methods for coating a base fiber with metals may include additional coating steps which act to either increase the thickness of a particular metal or metal alloy layer or add additional metal or metal alloy layers to the metalized fiber.

In some embodiments, the methods of the invention may further include the steps of infiltrating the metalized fiber mat with a second resinous material to form a pre-impregnated fiber ply called a pre-preg, and curing, hardening, or polymerizing the second resinous material of the pre-impregnated fiber ply to make a composite. In other embodiments, methods of the invention may further include the steps of infiltrating the metalized fiber mat with a second resinous material to form a pre-impregnated fiber ply, layering two or more pre-impregnated fiber plies to make a multi-layer fiber ply, and curing, hardening, or polymerizing the second resinous material of the pre-impregnated fiber plies to make a multi-layer composite. In still other embodiments, the methods of the invention may include the steps layering one or more pre-impregnated fiber plies with one or more composites, and curing, hardening, or polymerizing the second resinous material of the pre-impregnated fiber plies to make a multi-layer composite, and in yet other embodiments, the method may include the step of applying an adhesive layer to one or more composite or multi-layer composite layers and pressing the various layers together to form a multi-layer composite. Embodiments of the invention are not limited by the number of layers. For example, in some embodiments, two or more layers of pre-impregnated fiber ply and, in certain embodiments, composite may be pressed together to form a multi-layer composite, and in other embodiments, 3, 4, 5, 6, 8 or more pre-impregnated fiber plies and, in some cases, composite layers may be pressed together to form a multi-layer composite. In yet other embodiments, an additional material may be provided as a layer between pre-impregnated fiber plies and composite layers such as, for example, various embodiments, of methods may include applying one or more adhesive layers, one or more shock absorption layers, and the like.

In further embodiments, a woven or non-woven mat may be prepared from unmetalized fibers and the unmetalized fiber mat may be metalized by applying one or more metal layers by sputtering. For example, in some embodiments, a method may include the step of chopping continuous fibers of, for example, graphite or glass or obtaining chopped fibers, combining the chopped fibers with a resinous material or binder to create a slurry, and fabricating a fiber mat from the slurry. The step of fabricating may include forming the slurry into a sheet or mat, extracting water from the slurry, and heating the binder material. After the mat has been fabricated, the methods of various embodiments may include the steps of applying a first metal layer onto the fiber mat by vacuum sputtering and applying a second metal layer onto the fiber mat by vacuum sputtering to produce a fiber mat that has been metalized. In further embodiments, the fiber mat that has been metalized may be infiltrated with a second resinous material to form a pre-impregnated fiber ply, and such pre-impregnated fiber plies may be cured or layered and/or cured to form composites, multilayer fiber plies, and multilayer composites using the steps described above. In yet further embodiments, one or more adhesive layers, shock absorption layers, or other additional layers may be applied to the pre-impregnated fiber plies, composites, multilayer fiber plies, and multilayer composites prepared from the fiber mats that have been metalized.

In additional embodiments of the invention, the method may include applying one or more layers of non-woven or woven metalized fibers dispersed in a resinous material or one or more metalized fiber mats to, for example, a mold to create a shaped article that includes incorporated metalized fibers. Such shaped articles may be prepared to fit within specific structural components of the object into which a pre-impregnated fiber ply, composite or multi-layer composite may be incorporated. For example, in some embodiments, a mold may be used to create a shaped multi-layer composite that specifically fits within a body panel of the hull of an aircraft. In some embodiments, the method may include the step of incorporating one or more layers of non-woven or woven metalized fibers dispersed in a binder material or one or more metalized fiber mats into the lay-up of a structural component of an object prepared from, for example, carbon fiber. For example, in certain embodiments, a carbon fiber lay-up for, for example, a body panel of the hull of an aircraft may be prepared and one or more layers of non-woven or woven metalized fibers dispersed in a resinous material or binder or one or more metalized fiber mats may be incorporated into the lay-up before curing. Without wishing to be bound by theory, the resulting composite formed as a shaped article may provide electrical conductivity, electromagnetic shielding and, in some conditions, low observable characteristics to the object into which shaped articles are incorporated.

Various modifications of the invention, in addition to those described herein, will be apparent to those skilled in the art from the foregoing description. Such modifications are intended to fall within the scope of the invention.

EXAMPLE

In order that the invention disclosed herein may be more efficiently understood, the following example is provided. This example is for illustrative purposes only and is not to be construed as limiting the invention in any manner.

Example 1

A plurality of graphite fibers were metalized by first coating the fibers with copper to impart conductivity. The metalized graphite fibers were then chopped and dispersed in an aqueous slurry. Fabrication procedures were then implemented to create a non-woven metalized fiber mat. A corrosion resistant Tungsten metal coating was then applied to the conductive fiber mat by vacuum sputtering to provide a corrosion-resistant outer layer.

Example 2

A plurality of graphite fibers were first chopped and added to a slurry containing chopped polyester fiber and an aqueous liquid. The graphite fiber slurry was then dried and subsequently heated to selectively bind the graphite fibers in a loose non-woven mat such that the mat could be handled by an operator. The mat was subsequently placed in multi target rotary vacuum chamber capable of operating at 60 KW of power and a high vacuum of 10 E-7 Torr of pressure. The mat was sequentially sputtered with a copper layer followed by a tungsten layer, such that the metalized layers uniformly and completely covered the circumference of the fiber (360 degree coverage) in a single deposition step. The surface resistance of the metalized mat was subsequently measured at less than 0.2 ohms/sq and was free from defects often seen in electroless plated coatings. A neutral salt fog chamber per ASTM B117 was used to test the corrosion resistance of the metalized graphite fiber mat. The metalized graphite fiber mat demonstrated high corrosion-resistance, exhibiting little corrosion after 500 hours at 95° F. in the fog chamber.

What is claimed is:

1. A metalized fiber mat comprising:
   non-woven fibers having
     a conductive metal coating of a uniform thickness on said fibers produced by a vacuum deposition technique wherein said conductive metal comprises copper; and
     a corrosion-resistant metal coating of a uniform thickness, said corrosion-resistant metal completely covers said conductive metal coating, wherein the corrosion-resistant metal coating comprises tungsten,
   wherein coated non-woven fibers are held together with an organic binder,
   wherein the metalized fiber mat has a Delcon resistivity of less than 1 ohm/sq.

2. The metalized fiber mat of claim 1, wherein said fibers have a length of about 2 mm to about 50 mm.

3. The metalized fiber mat of claim 1, wherein said fibers have a length of about 5 mm to about 15 mm.

4. The metalized fiber mat of claim 1, wherein said non-woven fibers comprise a fiber from the group consisting of graphite, carbon, glass, electronic grade glass, silica, basalt and combinations thereof, polymer, polyurethane, polyester, polyamide, polyimide, polyethylene, para-aramid and co-polymers thereof.

5. The metalized fiber mat of claim 1, further comprising at least one sheet of dampening material integrated to the metalized mat to damper vibration.

6. The metalized fiber mat of claim 1, wherein said conductive metal coating further comprises a metal selected from the group consisting of silver, tungsten, molybdenum, rhodium, iridium, platinum, titanium, annealed copper, gold, and alloys thereof.

7. The metalized fiber mat of claim 1, wherein said corrosion-resistant metal coating further comprises a metal selected from the group consisting of molybdenum, tantalum, nickel, niobium and alloys thereof.

8. The metallized fiber mat of claim 1, wherein the mat is flexible.

9. The metalized fiber mat of claim 8, wherein the mat can conform to a predetermined surface.

10. The metallized fiber mat of claim 1, wherein the metallized fiber mat has a surface resistance of less than about 5 ohms/sq.

11. The metallized fiber mat of claim 1, wherein the conductive metal coating has a thickness of from about 10 E-7 meters to about 10 E-6 meters.

12. The metallized fiber mat of claim 1, wherein the corrosion-resistant metal coating has a thickness of from about 10 E-7 meters to about 10 E-6 meters.

\* \* \* \* \*